United States Patent [19]

Souchere

[11] Patent Number: 4,611,191
[45] Date of Patent: Sep. 9, 1986

[54] NON-MAGNETIC CORE CURRENT SENSOR

[75] Inventor: Claude Souchere, Grenoble, France

[73] Assignee: Merlin Gerin, Grenoble Cedex, France

[21] Appl. No.: 731,268

[22] Filed: May 7, 1985

[30] Foreign Application Priority Data

May 21, 1984 [FR] France .................. 84 08000

[51] Int. Cl.⁴ .............................................. H01F 15/04
[52] U.S. Cl. .................................. 336/84 R; 336/174; 336/229
[58] Field of Search ................ 336/84 R, 84 C, 84 M, 336/69, 70, 173, 174, 175, 229

[56] References Cited

U.S. PATENT DOCUMENTS

| | | | |
|---|---|---|---|
| 3,517,361 | 6/1970 | Reifel | 336/84 C |
| 3,525,964 | 8/1970 | Stevenson | 336/175 X |
| 3,555,476 | 1/1971 | Brennen et al. | 336/84 M X |
| 3,654,543 | 4/1972 | Isogai et al. | 336/175 X |
| 3,665,356 | 5/1972 | Douglas et al. | 336/84 R X |
| 3,925,744 | 12/1975 | Canney | 336/229 X |

FOREIGN PATENT DOCUMENTS

| | | |
|---|---|---|
| 1056735 | 11/1957 | Fed. Rep. of Germany . |
| 561512 | 1/1923 | France . |
| 874133 | 7/1941 | France . |
| 1508358 | 11/1966 | France . |

Primary Examiner—Thomas J. Kozma
Attorney, Agent, or Firm—Parkhurst & Oliff

[57] ABSTRACT

Non-magnetic sensor having a ring-shaped core (10), through which a primary conductor (12) runs and which supports a secondary winding (14). A magnetic shield (18) encloses the core (10), whereas a non-magnetic conducting shield (22) is inserted between the conductor (12) and the core (10) with the winding (14). The sensor is applicable to medium and high voltage installations.

6 Claims, 4 Drawing Figures

NON-MAGNETIC CORE CURRENT SENSOR

BACKGROUND AND SUMMARY OF THE INVENTION

The invention relates to a current sensor comprising a ring core made of non-magnetic material, a primary winding constituted by a conductor running through said core, a secondary winding constituted by a turn wound on the core and a magnetic shield externally surrounding the core with the secondary winding.

Non-magnetic sensors of the kind mentioned are not sensitive to magnetic saturation phenomena, but they deliver a relatively weak signal. They are commonly used in electronic monitoring or protection systems, in particular in low voltage, but their use in medium and high voltage gives rise to problems of noise, the level of which can reach that of the signal.

The object of the present invention is to enable a non-magnetic current sensor to be produced, having a low noise level, particularly in medium or high voltage installations.

The sensor according to the present invention is characterized by the fact that it comprises an electrostatic shield made of non-magnetic conducting material, fitted between the primary conductor and the non-magnetic core with the secondary winding.

The external magnetic shield provides shielding which enables external interference, notably any external noise induction, to be suppressed. It has however been found that this external shielding is insufficient and that the signal delivered by the sensor varies with the voltage applied to the sensor. By adding an electrostatic shield according to the invention, this disturbance of the signal delivered by the current sensor can be eliminated and an accurate measurement signal be obtained, even in high voltage installations. The study of this phenomenon shows that it is caused by the capacitance existing between the primary conductor and the external layer of the secondary winding, which explains the efficiency of the electrostatic shield.

It is advantageous to connect the electrostatic shield to the earth or ground to avoid any electrical potential in the measurement zone.

The magnetic shield is preferably a cylindrical shell made of a high magnetic permeability material, inside which is housed the ring core supporting the secondary winding. The conducting electrostatic shield has a very low permeability and can be made of copper or aluminium or any other suitable material. Various shield structures are conceivable, notably a rigid part fitted partially or totally around the core with its winding or a conductive band wrapped around the core and its winding or again a single conducting layer, for example a coat of paint or a conductive coating.

BRIEF DESCRIPTION OF THE DRAWING

Other advantages and characteristics will become more clearly apparent from the description which follows of two embodiments of the invention, given as examples only and represented in the accompanying drawings, in which.

DETAILED DESCRIPTION OF THE PREFERRED EMBODIMENTS

Figure 1:
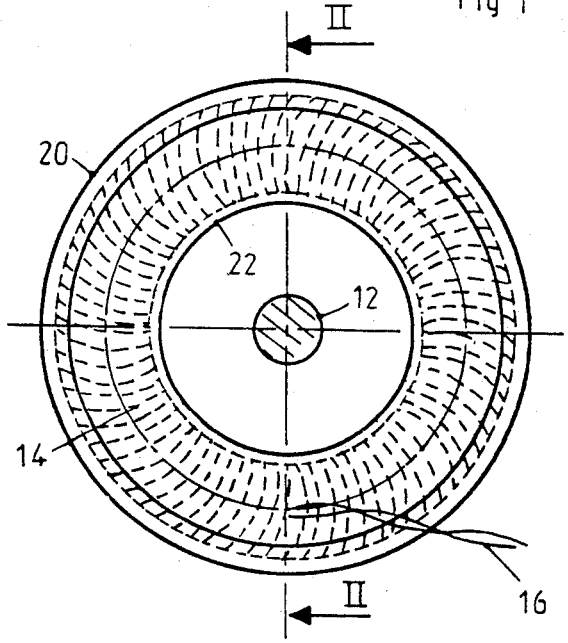
FIG. 1 is an elevational view of a sensor according to the invention.

In the figures, a ring-shaped core 10 made of a non-magnetic material has running axially through it a conductor 12 in which the current to be measured flows. The conductor 12 belongs to an installation, notably a medium voltage or high voltage switchboard or apparatus, and constitutes the once-through primary winding of the sensor. This primary winding can comprise several passages in a manner well known in the art. A secondary winding 14 having connecting wires 16 is wound around the ring core 10. The core 10 and the winding 14 are coaxially fitted inside a shield 18, in the form of a cylindrical shell, which encloses them with little clearance and extends laterally on both sides. The shield 18 is made of a high magnetic permeability material such as ferrosilicon or mumetal and constitutes an external sensor shielding.

Figure 2:
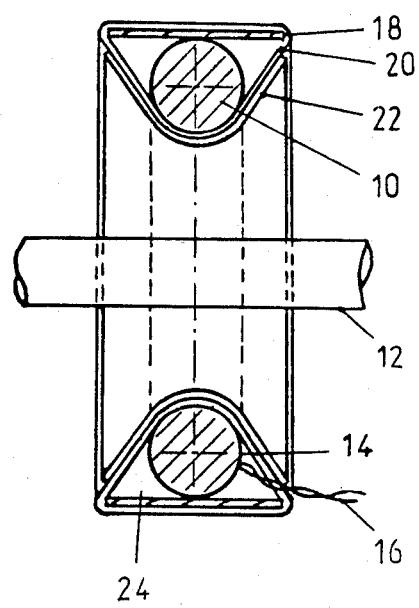
FIG. 2 is a section along the line II—II of FIG. 1.

In FIGS. 1 and 2, the core 10, winding 14 and shield 18 assembly is enclosed in an insulating sleeve 20, for example made up of a strip overlappingly wound around the assembly. A ring-shaped internal shield 22 presents a V-shaped external recess, in which is housed the core 10 with the winding 14. The profile of the bottom of the recess 24 corresponds to that of the core 10 which fits snugly into the bottom of the recess 24. The V-shaped walls of the recess 24 extend in proximity to the external shield 18, which almost totally obturates the recess 24 with the insulating sleeve 20 interposed, which follows the outline of the recess 24.

The internal shield 22 can be fitted on the core 10 by deformation or by assembly of complementary parts or in any other way. The internal shield 22 is made of a conducting material which is either non-magnetic or of very low permeability, such as copper or aluminium, and constitutes an electrostatic shield, advantageously earthed or grounded and inserted between the primary conductor 12 and the outside of the secondary winding 14. Tests have shown that this shielding 22 enables a signal to be obtained at the terminals 16 of the secondary winding 14 almost independent from the current voltage flowing through the conductor 12. The assembly can be coated with a moulded insulating material and it is clear that insulation by the sleeve 20 can be performed in a different manner, notably by coating. The ring shape is the most usual but the electrostatic shield according to the invention can be used with toruses or rings which are oblate or of a different shape or cross-section, notably rectangular.

Figure 3:
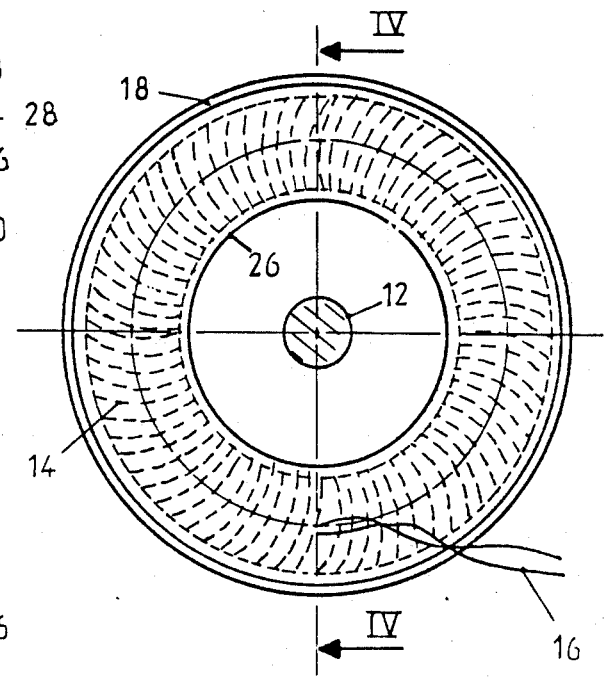
FIGS. 3 and 4 are similar views to those of FIGS. 1 and 2, illustrating an alternative embodiment.
Figure 4:
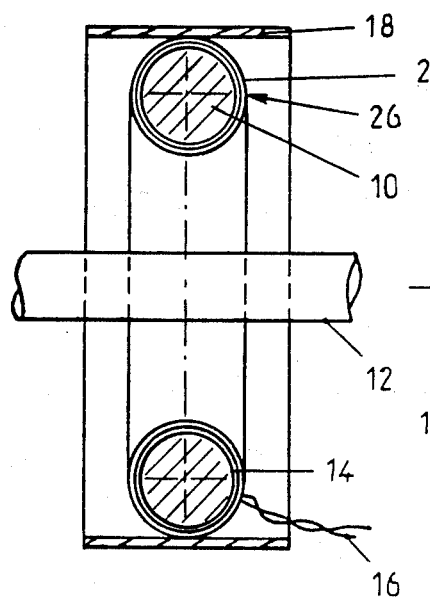

FIGS. 3 and 4 illustrate an alternative embodiment of the internal electrostatic shield, the same reference numbers denoting in these figures similar or identical parts to those in FIGS. 1 and 2. The electrostatic shield is made up of a hollow circular ring or torus 26, inside which the core 10 supporting the winding 14 is housed with little clearance, with an insulating sleeve 28 itself ring-shaped fitted between them. In this alternative embodiment, the electrostatic shield 26 completely surrounds the core 10 and the winding 14 and extends on the external magnetic shield 18 side, which has no effect on the operation of the sensor.

The invention is of course not limited to the embodiments more specifically dealt with here.

What is claimed is:

1. Current sensor comprising a ring core made of a non-magnetic material, a primary winding constituted by a conductor running through said core, a secondary winding constituted by a turn wound on the core, an internal electrostatic shield made of a non-magnetic conducting material inserted between the primary conductor and the non-magnetic core with the secondary winding and an external magnetic shield enclosing the core with the secondary winding.

2. Current sensor according to claim 1, wherein the external magnetic shield is constituted by a cylindrical shell coaxially enclosing and immediately adjacent the ring core with the secondary winding, said shell extending on both sides of the core.

3. Current sensor according to claim 1, wherein the magnetic shield is made of material with a high magnetic permeability.

4. Current sensor according to claim 1, wherein the internal non-magnetic shield is constituted by a ring coaxially embracing the internal circumference of the core with the secondary winding.

5. Current sensor according to claim 4, wherein said internal shield has a V-shaped recess, in which is housed the core with the secondary winding, walls of the recess extending on both sides of the core in proximity to the external shield, which substantially obturates the opening of the recess.

6. Current sensor according to claim 4, wherein the internal non-magnetic shield is constituted by a hollow ring inside which is housed the core with the secondary winding.

* * * * *